United States Patent [19]
Gabillard

[11] Patent Number: 4,644,189
[45] Date of Patent: Feb. 17, 1987

[54] DECODER CIRCUIT FOR A STATIC RANDOM ACCESS MEMORY

[75] Inventor: Bertrand Gabillard, Paris, France

[73] Assignee: U.S. Philips Corporation, New York, N.Y.

[21] Appl. No.: 649,453

[22] Filed: Sep. 11, 1984

[30] Foreign Application Priority Data

Sep. 16, 1983 [FR] France ............................ 83 14774

[51] Int. Cl.⁴ ................ H03K 19/094; H03K 19/017; G11C 8/00
[52] U.S. Cl. .................................... 307/449; 307/450; 365/230
[58] Field of Search ..................... 307/449, 450, 463; 365/230

[56] References Cited

U.S. PATENT DOCUMENTS

| | | | |
|---|---|---|---|
| 3,775,693 | 11/1973 | Proebsting | 307/450 |
| 3,778,782 | 12/1973 | Kitagawa | 307/449 X |
| 3,786,277 | 1/1974 | Basse | 365/230 |
| 3,863,230 | 1/1975 | Regitz | 307/449 X |
| 4,038,563 | 7/1977 | Zuleeg et al. | 307/450 X |

FOREIGN PATENT DOCUMENTS

40331  4/1981  Japan ................... 307/450

OTHER PUBLICATIONS

Ino et al, "GaAs 1KB Static Ram With E/D MESFET DCFL"; *IEEE GaAs I.C. Symposium* 1982.
Liechti, "GaAs FET Logic"; Proceedings of 6th Int'l Symp. on GaAs and Related Cmpnds; Edinburgh England, 9/1976; pp. 227–236.
Nuzillat et al; *IEE Proc.*, vol. 127, pt. I, No. 5; pp. 286–296; 10/1980.
Lehovec et al, "Analysis of GaAs FET's for Integrated Logic"; *IEEE Trans. on Electron Devices*; vol. ED-27, No. 6, pp. 1074–1091; 6/1980.
Zuleeg et al, "Femtojoule High-Speed Planar GaAs E-JFET Logic", *IEEE Trans. on Electron Devices*; vol. ED-25; No. 6, pp. 628–639; 6/1978.
Homan, "FET Depletion Load Push-Pull Logical Circuit", *IBM TDB*; vol. 18, No. 3, pp. 910–911; 8/1975.
Chang, "An Enhanced Push-Pull NOR"; *IBM-TDB*; vol. 18, No. 9, pp. 2960–2961; 2/1976.

*Primary Examiner*—Larry N. Anagnos
*Attorney, Agent, or Firm*—Thomas A. Briody; William J. Streeter; Leroy Eason

[57] ABSTRACT

A decoder circuit for a static random access memory cell and which may be integrated in monolithic form using gallium arsenide field effect transistors. The circuit comprises a first logic NOR-gate $P_1$ having $(n+1)$ inputs on which the n coded memory address signals or their complements are received, and also the chip-enable selection signal SB. The gate $P_1$ is connected by a load resistor R to a supply voltage $V_{DD1}$. A second NOR-gate $P_2$ receives the same inputs as the gate $P_1$ and has as its load a transistor $T_0$ the gate electrode of which receives the output of the gate $P_1$ and the drain of which is connected to a power supply voltage $V_{DD2}$ which is less than $V_{DD1}$. The voltage $V_{DD2}$ is also the supply voltage for the memory cell, and is set at the clipping value of the gate junctions of the constituent transistors of that cell. The output $V_S$ of the decoder is produced at the drains of the transistors forming the second NOR-gate $P_2$ which are connected to the source electrode of the load transistor $T_0$. The inputs of the NOR-gates receive a chip-enable selection signal SB after application of the n coded memory address signals, thereby achieving reduced access time for the memory cell.

8 Claims, 4 Drawing Figures

DECODER CIRCUIT FOR A STATIC RANDOM ACCESS MEMORY

BACKGROUND OF THE INVENTION

1. Field of the Invention

The invention relates to a decoder circuit for an integrated monolithic static random access memory, which circuit is formed by a logic NOR-gate (P1) comprising a row of field effect transistors whose gate electrodes receive the n coded memory address signals or the complements thereof, the sources thereof being connected to ground whilst their drains are interconnected and constitute the output of the NOR-gate (P1) which is connected to a supply terminal ($V_{DD1}$) via a load and which is connected to the gate electrode of a transistor of an output inverter stage.

2. Description of the Related Art

Memory circuits are virtually always organized in form of a network of cells which exhibits the structure of a matrix. Each cell, corresponding to a bit (=binary digit), is situated at the intersection of two lines, a horizontal line or row and a vertical line or column. These lines correspond to the memory addresses and are generally denoted as $X_1, X_2 \ldots, X_n$ for the rows and $Y_1, Y_2 \ldots, Y_n$ for the columns. Each cell of the memory thus has a unique address and can be selected by the simultaneous activation of the appropriate row and column. After selection of the cell, the data can be applied to the cell or be extracted from the cell via a pair of lines which are common to all cells and which are referred to as bit lines.

From the publication of M. Ino et al (Musashino Electrical Communication Laboratory) in the Proceedings "IEEE GaAs I.C. Symposium 1982", entitled "GaAs 1 Kb Static RAM with E/D MESFET DCFL", it is known to form a decoder circuit for a static RAM which is integrated in monolithic form on a gallium arsenide (GaAs) substrate and which is composed of field effect transistors (MESFET: Metal Semiconductor Field Effect Transistor). A decoder circuit as described in said document and illustrated in FIG. 1 on page 4 of this document is composed of elementary decoder circuits. Each elementary decoder is essentially formed by a NOR-gate which comprises n inputs, each of which is intended to receive one of the binary coded address inputs $a_1, a_2, \ldots, a_n$, expressed in the form of a true signal or the complement thereof and formed before being input into the decoder by an intermediate circuit (ADDRESS BUFFER) in order to obtain on the output of the NOR-gate a combination of bits which are produced by the logic NOR-function and which constitute the address of a row or a column.

This NOR-gate is formed by enhancement-type gallium arsenide field effect transistors with a pinch off voltage $V_T \geq 0$, which means that they are conductive only when the voltage applied to the gate electrode exceeds this voltage $V_T$. The transistors forming this NOR-gate are connected in parallel, their common source being connected to ground whilst their common drain is connected to the shortcircuited gate-source of a depletion transistor which is used as said active load.

When the values of the output signal of the NOR-gate change from 0 to 1 or from 1 to 0, the associated voltage charges or discharges the output capacitance of the circuit. In order to achieve equivalent charging and discharging periods of this capacitance, the output signal of the NOR-gate is applied to the input of an inverter stage so that the true output signal and its complement become simultaneously available, after which these signals are applied to respective ones of the two inputs of a pushpull stage. The inverter stage used comprises an enhancement-type transistor as the inverter transistor and a depletion transistor as the load. The pushpull stage also comprises an enhancement-type transistor which is connected to ground in common source arrangement, in series with a depletion transistor which is connected to the supply voltage in common drain arrangement.

For the decoder circuit, it is desirable, for example, te replace the depletion transistors forming the active loads by resistive loads since they are easier to realize from a technological point of view. Also, it is desirable to replace the depletion transistor of the pushpull stage by an enhancement-type transistor so that only a single type of transistor will be required for manufacture of such a circuit.

However, when a simple transposition of the circuit described in said document is attempted as proposed above, immediately the following problem is encountered: between the output of the NOR-gate and ground a parasitic diode appears due to the fact that the inverter transistor to which the output voltage is applied is of the Schottky type. This parasitic diode prevents the output signal of the NOR-gate from reaching a sufficiently high level to unblock the transistor of the pushpull stage to which the output signal is applied. The pushpull stage is thus rendered ineffective, and in these circumstances the charging of the output capacitance of the elementary decoder will be difficult and time-consuming.

SUMMARY OF THE INVENTION

It is the object of the invention to provide a decoder circuit for a static integrated semiconductor RAM memory which enables a faster access to a memory cell and which has a low power consumption. It is a further object of the invention to provide such a decoder circuit which is comparatively simple to manufacture, thus enabling a higher production yield.

To this end, a decoder circuit in accordance with the invention is characterized in that the source of the transistor of the inverter stage is connected to the common drains of a second row of transistors which form a second NOR-gate (P2), the common drains forming the output of the decoder circuit, the sources of the transistors of the second row being connected to ground, the second row of transistors receiving the n coded address signals on their gate electrodes, the first and the second row of transistors comprising a selection transistor whose gate electrode receives the chip-enable selection signal SB, said chip-selection signal being applied to the selection transistor after application of the coded memory address signals to each of the two NOR-gates (P1, P2).

The fact that it is not necessary to provide an elementary decoder circuit in accordance with the invention with an inverter stage between the actual decoder stage and the pushpull stage, as would be the case in the circuit described in the above document, achieves a very substantial reduction of the signal propagation time in the circuit. The omission of one stage also leads to a reduction of the power consumption; this reduction of the power consumption, moreover, is accentuated by the fact that the supply voltage of the second stage is lower than that of the first stage.

It is to be noted that a decoder circuit for a dynamic memory is known from U.S. Pat. No. 3,778,782, said circuit comprising two NOR-gates in a cascade arrangement. These NOR-gates are combined with an AND-gate and are controlled by clock pulses for precharge and logic operation. However, the decoder circuit of the patent does not achieve the high-speed of a decoder circuit in accordance with the present invention. In addition the decoder circuit disclosed in said U.S. patent may give rise to other problems. Although these can be solved by the stage disclosed in U.S. Pat. No. 3,863,230, such measures lead away from the comparatively simple circuitry of the decoder circuit in accordance with the present invention.

A preferred embodiment of a decoder circuit in accordance with the invention is characterized in that all transistors are of the enhancement type, the load of the first NOR-gate (P1) being a resistive load. The use of a single type of transistor and the use of a resistive load, which is simple to realize, enable the use of a less complicated production process which is very advantageous, especially when the decoder circuit is realized in an integrated gallium arsenide circuit, such as a GaAs memory circuit.

The invention is used in the field of ultra-fast cache memories for large computers such as used in the field of astronomy and meteorology, as well as for processors for flight simulators to enable the display of high-resolution digitized images.

For the realization of cache memories for such applications, the design of low-consumption, ultra-fast, static random access memories integrated in monolithic form is imperative. Therefore, a technology involving gallium arsenide field effect transistors is extremely attractive for the realization of such circuits because of the extremely high electronic mobility in this material which enables very short transit times in the transistors. Moreover, among the various technologies which can now be performed by means of gallium arsenide transistors, the DCFL technology (Direct Coupled Field-Effect Transistor Logic) is the one which offers at the same time the lowest power consumption and the highest integration density in combination with a very high speed. The elementary logic gate, or inverter, realized by means of this technology is composed of an enhancement-type field effect transistor (pinchoff voltage $V_T \geq 0$) which is associated with a load, and offers an output signal which is compatible with the input of the next logic gate.

These improvements, enabling the use of a smaller number of transistors, compensate for the fact that the use of a second NOR-gate requires a given number of additional transistors. Actually, in the course of the implantation of the circuit, each elementary decoder occupies, viewed in the vertical direction, the distance between two rows or two columns of the memory. When the surface area occupied by the elementary decoder is smaller than the area thus allocated thereto, some of said area is not used. It has been found that during the implantation of this circuit by means of the chosen logic, the second NOR-gate, paired with the first NOR-gate, can be very well placed without increasing the surface area for the decoder.

BRIEF DESCRIPTION OF THE DRAWINGS

The invention will be better understood on the basis of the following detailed description of the circuit which will be given with reference to the accompanying drawings, in which.

DESCRIPTION OF THE PREFERRED EMBODIMENTS

Figure 1:
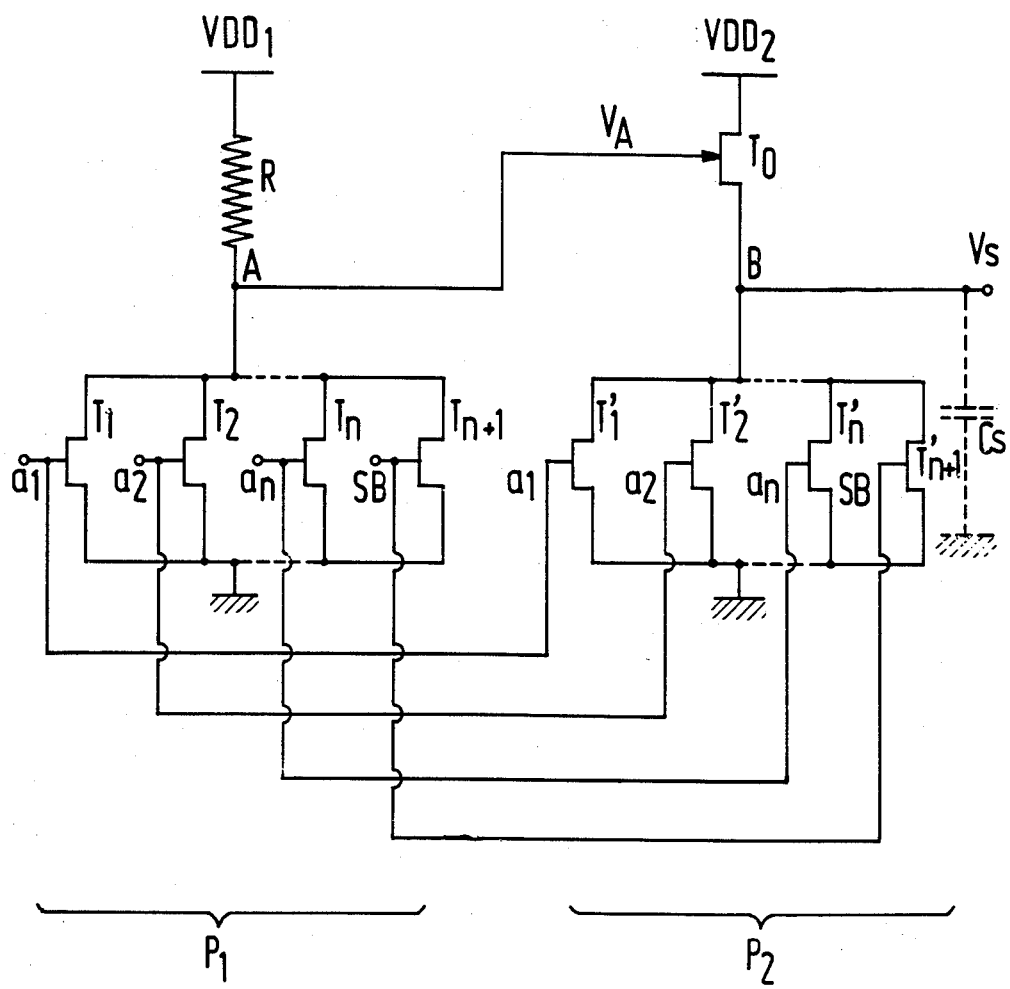
FIG. 1 shows an elementary decoder circuit in accordance with the invention.

As shown in FIG. 1, the elementary decoder circuit in accordance with the invention comprises a first NOR-gate $P_1$ which is formed by $n+1$ enhancement-type field effect transistors, n being the number of coded memory address signals. To n inputs of this first NOR-gate $P_1$ there are applied said n coded address signals in order to form the combination constituting the address of a line or a column. The chip-enable selection signal SB is applied to the last input of said NOR-gate $P_1$.

The load of this NOR-gate $P_1$ is formed by a resistor R which is realized by implantation of doping materials in the GaAs substrate. The supply voltage $V_{DD1}$ whereto this load R is connected has a value of 1.2 volts. The transistors of this NOR-gate $P_1$ are connected to ground in a common source arrangement. The output $V_A$ of the first NOR-gate $P_1$ is formed at the junction point A on the drains of the transistors connected to the load R, and is applied to the gate electrode of an enhancement-type field effect transistor $T_0$ whose drain carries the potential $V_{DD2}$ and whose source is connected to the junction point B on the drains of the $n+1$ enhancement-type field effect transistors which are connected in parallel and which thus form a second NOR-gate $P_2$. The common sources of the transistors constituting $P_2$ are connected to ground. The voltage $VDD_2$, having a value of 0.7 volts, is the supply voltage for these memory cells as appears from FIG. 2.

The n first inputs of the second NOR-gate $P_2$ receive the same coded address signals as the first NOR-gate $P_1$. The last input of the gate $P_2$ receives the chip-enable selection signal SB.

The output $V_S$ of the elementary decoder on the output line is formed at the junction point B on the common drain of the transistors of the gate $P_2$. The output signal $V_S$ charges a positive capacitance $C_S$ when it changes from 0 to 1.

When all inputs of $P_1$ are 0, the voltage $V_A$ on the junction point A can rise substantially to the value of the voltage $VDD_1$. The transistor $T_0$ whose gate electrode receives this voltage $V_A$ then becomes conductive. The output capacitance $C_S$ is then charged by the voltage $V_S$ which thus closely approaches the value of $VDD_2$, the transistors of the gate $P_2$ which receive the same signals as those of the gate $P_1$ then being blocked themselves.

However, when one of the inputs of the gate $P_1$ becomes 1, the value of the voltage $V_A$ becomes substantially equal to zero because one of the transistors whereto the signal "1" is applied becomes conductive. A voltage $V_A \approx 0$ is thus applied to the gate electrode of the transistor $T_0$ which is thus blocked. However, the same signal "1" is also applied to one of the transistors of the gate $P_2$ which becomes conductive. The transistor $T_0$ being blocked, the voltage $V_S$ then approaches 0 and the capacitance $C_S$ is quickly discharged.

Figure 2:
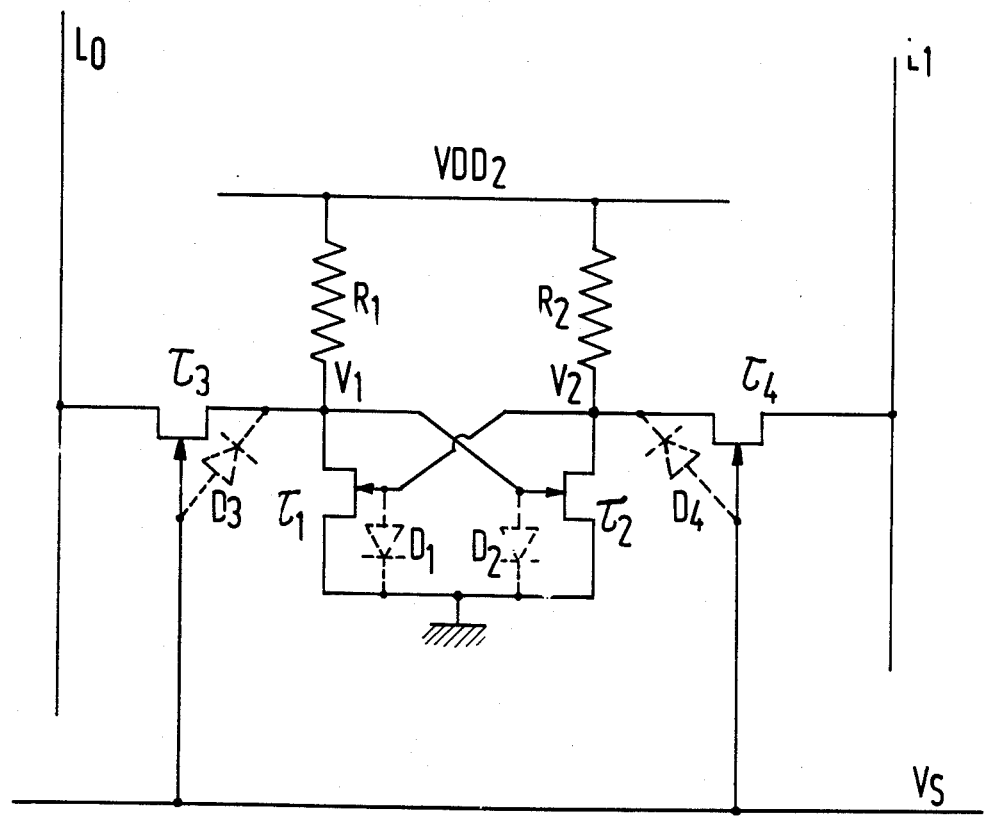
FIG. 2 shows a memory cell of the static random access memory associated with an elementary decoder circuit in accordance with the invention.

As appears from FIG. 2, a memory cell is formed by two transistors $\tau_1$ and $\tau_2$ which are connected in a bistable arrangement and which are powered, across the resistors $R_1$ and $R_2$, respectively, by the supply voltage $VDD_2$. Due to the presence of parasitic diodes $D_1$ and $D_2$ between the gate electrodes of these transistors and ground, caused by the fact that the transistors $\tau_1$ and $\rho_2$ are of the Schottky type, the signals $V_1$ and $V_2$ on the drains of the latter transistors will be clipped to the value of 0.7 volts.

Consequently, it suffices to power the cells of the memory with a voltage $VDD_2$ of 0.7 volts; any higher voltage will increase the consumption without improving the signal-to-noise ratio.

Also, the high or "1" level of the signal $V_S$ on the output line need not exceed 0.7 volts, because this voltage would otherwise be clipped by the further parasitic diodes $D_3$ and $D_4$ present between the gate electrode of the access transistors $\tau_3$ and $\tau_4$ of the Schottky type and ground, thus disturbing the correct operation of the memory cell by rendering the two transistors $\tau_3$ and $\tau_4$ conductive at the same time. This is way the transistor $T_0$ of the second stage of the elementary decoder is powered by the same voltage $VDD_2=0.7$ volts which powers the memory cells. Actually the resistor R which is connected to the supply voltage $VDD_1=1.2$ volts more than suffices for correct polarization of this transistor $T_0$. It is to be noted that in the circuit in accordance with the present invention the output signal $V_S$ is obtained by combining the coded address signals which are applied, as required for each signal in the form of the true signal or its complement, to the inputs of the NOR-gates.

Finally, it is to be noted that in the circuit in accordance with the invention the chip-enable selection signal SB is applied in a special way to the transistors which are equivalent to those which receive the coded address signals.

Figure 3A:
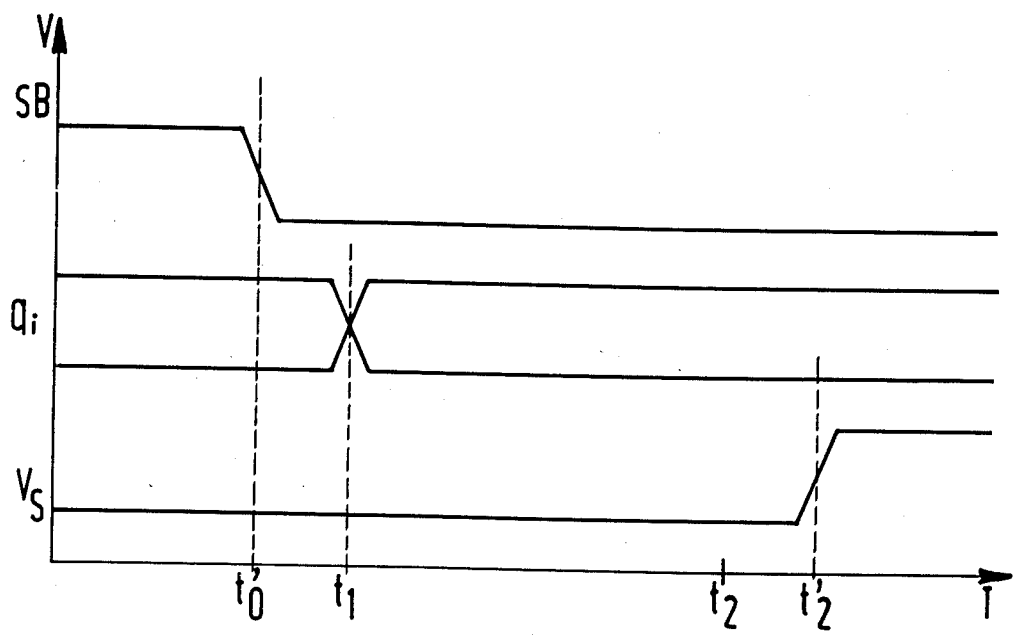
FIGS. 3a and 3b show the propagation diagram of the signal $V_S$ on the output line with respect to the chip-enable selection signal SB and with respect to the signal $a_i$ for the selection of the addresses $a_1, a_2, \ldots, a_n$ as a function of the time t.
Figure 3B:
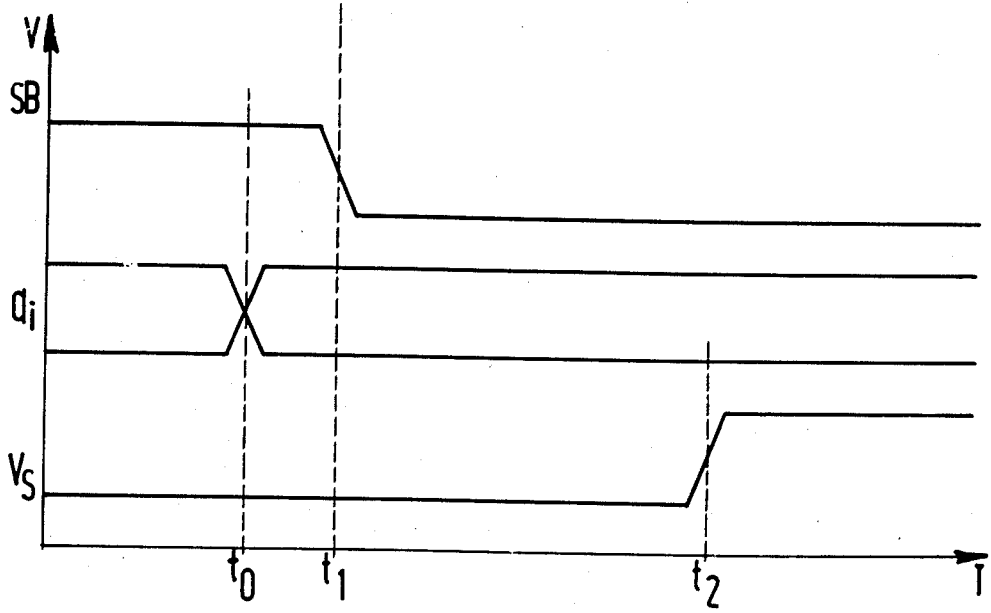

As appears from the FIGS. 3a and 3b, there are two selection modes for a memory cell. According to the first mode, for which the signal propagation diagram is shown in FIG. 3a, the chip-enable selection signal SB is set from the state "1" to the state "0" at the instant $t'_0$, whilst the selection $a_i$ of an address combination $a_1, a_2, \ldots a_n$ takes place at the instant $t_1$. The output signal $V_S$ thus appears on the output line at the instant $t'_2$ being defined by the difference with respect to $t_1$.

$\Delta t'_2 = t'_2 - t_1$ is a function of the propagation time in the circuit, which cannot be influenced. This time $\Delta t'_2$ constitutes the memory access time in this first mode of operation.

The mode of operation in accordance with the invention and the signal propagation diagram for this mode are shown in FIG. 3b. The selection $a_i$ of an address combination $a_1, a_2, a_n$ is applied to the transistors $T_1, T_2, \ldots T_n$ at the instant $t_0$, the chip-enable selection signal SB being applied to the transistor $T_{n+1}$ at the instant $t_1$. The output signal $V_S$ then appears on the output line at an instant $t_2$ which is defined by:

$$t_2 - t_0 \neq t'_2 - t_1$$

In this second mode of operation, the memory access time is given by the difference:

$$\Delta t_2 = t_2 - t_1 < \Delta t'_2$$

The circuit in accordance with the invention thus enables operation in a mode which achieves a reduced memory access time.

In a particular embodiment of a circuit in accordance with the invention, the resistors and the transistors had the following characteristics:
Resistor $R=20$ KΩ.
Length of the gate electrode of the transistor $L=0.9$ μm.
Width of the transistors of the gate $P_1 \, l=7$ μm.
Width of the transistors of the gate $P_2 \, l=7$ μm.
Width of the transistor $T_0 \, l=17$ μm.
Supply voltage $VDD_1=1.2$ V.
Supply voltage $VDD_2=0.7$ V.
Pinchoff voltage $V_T=0.1$ V.

In a particular embodiment of the memory cell the resistors and the transistors had the following characteristics:
Load resistor $R_1=R_2=20$ kΩ.
Width of the transistors $\tau_1$ and $\tau_2 \, l=8$ μm.
Length of the gate electrode of the transistors $L=0.9$ μm.
Width of the transistors $\tau_3$ and $\tau_4 \, l=11$ μm.
Pinchoff voltage $V_T=0.1$ V.

With these values, a propagation time of 0.2 ns was obtained in an elementary decoder circuit in accordance with the invention.

For application to a static random access memory, the decoder circuit may be composed of $2^n$ identical elementary decoder circuits which are constructed in accordance with the invention for the activation of the $2^n$ rows of the memory and of $2^P$ identical elementary decoder circuits in accordance with the invention for the activation of the $2^P$ columns of the memory.

It will be apparent that the use of the invention is not restricted to cache memories formed by means of field effect transistors which are integrated on a gallium arsenide substrate and that many alternatives are feasible, notably as regards the size, the characteristics and the supply voltages for the transistors, without departing from the scope of the present invention as defined by the following claims.

What is claimed is:

1. A decoder circuit for an integrated monolithic static random access memory, which circuit comprises a first logic NOR-gate (P1) formed by a first row of field effect transistors whose gate electrodes receive "n" coded memory address signals; the sources of said first row of transistors being connected to ground and the drains thereof being connected in common to an output terminal of the first NOR-gate (P1), such output terminal being connected by a load to a source of supply voltage $V_{DD1}$ and being further connected to the gate electrode of a transistor of an output inverter stage; the source of the inverter stage transistor constituting the output terminal of the decoder circuit and being connected to the common drains of a second row of transistors which form a second NOR-gate (P2); the drain of the inverter stage transistor being connected to a source of supply voltage $V_{DD2}$; the sources of the transistors of the second row being connected to ground and the gate electrodes thereof receiving the "n" coded address signals; each of said first and second rows of transistors comprising a selection transistor being parallel-connected to the respective rows of transistors and having a gate electrode for receiving a common chip-enable selection signal (SB), whereby said chip-enable selection signal (SB) being applied to the selection transistors after the coded memory address signals are applied to each of the two NOR-gates (P1, P2), thereby achieving reduced access time for the random access memory.

2. A decoder circuit as claimed in claim 1, characterized in that all transistors therein are of the enhancement type and the load of the first NOR-gate (P1) is a resistive load.

3. A decoder circuit for a static random access memory as claimed in either of claims 1 or 2, characterized in that the supply voltage ($V_{DD1}$) for the first NOR-gate (P1) is higher than the supply voltage ($V_{DD2}$) for the second NOR-gate (P2).

4. A circuit as claimed in claim 3, characterized in that the supply voltage $VDD_1 = 1.2$ V and the supply voltage $V_{DD2} = 0.7$ V.

5. A decoder circuit as claimed in claim 2, characterized in that the length of the gate electrode of each of the transistors is $L = 0.9$ μm, the pinchoff voltage of these transistors being $V_T = 0.1$ V.

6. A decoder circuit as claimed in claim 2, characterized in that the resistance of the resistive load is $R = 20$ Kohms.

7. A monolithic integrated circuit comprising a random access memory and a decoder circuit as claimed in claim 1, characterized in that all of the transistors therein are gallium arsenide field effect transistors.

8. A monolithic integrated circuit as claimed in claim 7, characterized in that the supply voltage for the random access memory is equal to the supply voltage $V_{DD2}$ for the second NOR-gate (P2) of the decoder circuit.

* * * * *